(12) United States Patent
Kimura (10) Patent No.: US 8,496,462 B2
(45) Date of Patent: Jul. 30, 2013

(54) IMPRINT APPARATUS AND ARTICLE MANUFACTURING METHOD

(75) Inventor: Atsushi Kimura, Saitama (JP)

(73) Assignee: Canon Kabushiki Kaisha (JP)

( * ) Notice: Subject to any disclaimer, the term of this patent is extended or adjusted under 35 U.S.C. 154(b) by 46 days.

(21) Appl. No.: 12/963,890

(22) Filed: Dec. 9, 2010

(65) Prior Publication Data

US 2011/0133354 A1   Jun. 9, 2011

(30) Foreign Application Priority Data

Dec. 9, 2009   (JP) .................................. 2009-279814

(51) Int. Cl.
   *B29C 45/76*   (2006.01)
(52) U.S. Cl.
   USPC .......... 425/150; 425/135; 425/385; 264/40.1; 264/40.5; 264/293
(58) Field of Classification Search
   USPC ............... 264/40.5, 293, 40.1; 425/150, 385, 425/135
   See application file for complete search history.

(56) References Cited

U.S. PATENT DOCUMENTS

| | | | |
|---|---|---|---|
| 7,281,921 B2 | 10/2007 | Watts et al. | |
| 7,418,902 B2* | 9/2008 | Kruijt-Stegeman et al. | .. 101/485 |
| 7,658,601 B2 | 2/2010 | Kasumi | |
| 2004/0022888 A1* | 2/2004 | Sreenivasan et al. | ...... 425/174.4 |
| 2005/0064054 A1* | 3/2005 | Kasumi | .......................... 425/112 |
| 2006/0157444 A1* | 7/2006 | Nakamura et al. | ............... 216/54 |
| 2006/0275524 A1* | 12/2006 | Santen et al. | .................. 425/385 |
| 2008/0040942 A1* | 2/2008 | Eales et al. | ...................... 33/707 |

FOREIGN PATENT DOCUMENTS

| | | | |
|---|---|---|---|
| JP | 2005-101201 A | | 4/2005 |
| JP | 2005331542 A | * | 12/2005 |
| JP | 4185941 B2 | | 11/2008 |
| JP | 2010-080863 A | | 4/2010 |

* cited by examiner

*Primary Examiner* — Amjad Abraham
(74) *Attorney, Agent, or Firm* — Rossi, Kimms & McDowell LLP (57) ABSTRACT

The present invention provides an imprint apparatus which transfers a pattern of a mold onto a resin applied on a substrate, including a structure including a mold chuck which holds the mold, a first measurement unit configured to measure a position of a reference portion of the structure, a second measurement unit configured to measure a position of the mold with respect to the reference portion, and a controller configured to control a relative positional relationship between the mold and the substrate, based on the measurement result obtained by the first measurement unit and the measurement result obtained by the second measurement unit, the second measurement unit including a head formed on the mold chuck, and measuring the position of the mold with respect to the reference portion by reading a scale formed on the mold by the head.

7 Claims, 8 Drawing Sheets

| SYMBOL | MEASUREMENT VALUE | INTER-FEROMETER USED | MEASUREMENT REFERENCE | REMARKS |
|---|---|---|---|---|
| Xoo | X-DIRECTION POSITION | 34a | APPARATUS REFERENCE MEMBER 14b | MEASUREMENT VALUE OF OAS 31 |
| Xow | X-DIRECTION POSITION | 34a | APPARATUS REFERENCE MEMBER 14b | MEASUREMENT VALUE OF SUBSTRATE STAGE 24. ONLY THIS INTERFEROMETER CAN MEASURE WHEN SUBSTRATE STAGE 24 IS ON Y-SIDE |
| Xowo | X-DIRECTION POSITION | - | - | CALCULATE BY Xow − Xoo. TREAT AS RELATIVE POSITION MEASUREMENT VALUE OF SUBSTRATE STAGE 24 BASED ON OAS 31 |
| Xtt | X-DIRECTION POSITION | 15g(UPPER) | X-DIRECTION APPARATUS REFERENCE MEMBER 14c | MEASUREMENT VALUE OF REFERENCE PORTION |
| Xtw | X-DIRECTION POSITION | 15g(MIDDLE) | X-DIRECTION APPARATUS REFERENCE MEMBER 14c | MEASUREMENT VALUE OF SUBSTRATE STAGE 24 |
| Xtwt | X-DIRECTION POSITION | - | - | CALCULATE BY Xtw − Xtt. TREAT AS RELATIVE POSITION MEASUREMENT VALUE OF SUBSTRATE STAGE 24 BASED ON REFERENCE PORTION |

F I G. 7B

| | | | |
|---|---|---|---|
| $\theta t$ | ωZ-DIRECTION ANGLE | 15b, 15a | Y-DIRECTION APPARATUS REFERENCE MEMBER 14a | CALCULATE BY 15b − 15a. ANGLE MEASUREMENT VALUE OF REFERENCE PORTION |
| $\theta w$ | ωZ-DIRECTION ANGLE | 15c, 15d | Y-DIRECTION APPARATUS REFERENCE MEMBER 14a | CALCULATE BY 15c − 15e. ANGLE MEASUREMENT VALUE OF REFERENCE PORTION |
| $\theta wt$ | ωZ-DIRECTION ANGLE | — | — | CALCULATE BY θw − θt. RELATIVE ANGLE MEASUREMENT VALUE OF SUBSTRATE STAGE 24 BASED ON REFERENCE PORTION |
| $\omega Yoo$ | ωY-DIRECTION ANGLE | 34a | APPARATUS REFERENCE MEMBER 14b | ANGLE MEASUREMENT VALUE OF OAS 31 |
| $\omega Yow$ | ωY-DIRECTION ANGLE | 34a | APPARATUS REFERENCE MEMBER 14b | ANGLE MEASUREMENT VALUE OF SUBSTRATE STAGE 24. ONLY THIS INTERFEROMETER CAN MEASURE WHEN SUBSTRATE STAGE 24 IS ON Y-SIDE |
| $\omega Yowo$ | ωY-DIRECTION ANGLE | — | — | CALCULATE BY ωYow − ωYoo. TREAT AS RELATIVE ANGLE MEASUREMENT VALUE OF SUBSTRATE STAGE 24 BASED ON OAS 31 |
| $\omega Ytt$ | ωY-DIRECTION ANGLE | 15g(UPPER) | X-DIRECTION APPARATUS REFERENCE MEMBER 14c | ANGLE MEASUREMENT VALUE OF REFERENCE PORTION |
| $\omega Ytw$ | ωY-DIRECTION ANGLE | 15g(MIDDLE) | X-DIRECTION APPARATUS REFERENCE MEMBER 14c | ANGLE MEASUREMENT VALUE OF SUBSTRATE STAGE 24 |
| $\omega Ytwt$ | ωY-DIRECTION ANGLE | — | — | CALCULATE BY ωYtw − ωYtt. TREAT AS RELATIVE ANGLE MEASUREMENT VALUE OF SUBSTRATE STAGE 24 BASED ON REFERENCE PORTION |

IMPRINT APPARATUS AND ARTICLE MANUFACTURING METHOD

BACKGROUND OF THE INVENTION

1. Field of the Invention

The present invention relates to an imprint apparatus and article manufacturing method.

2. Description of the Related Art

The imprint technique is a technique capable of transferring nanoscale micropatterns, and is beginning to be put into practical use as one nanolithography technique of mass-producing magnetic storage media and next-generation semiconductor devices. In the imprint technique, a mold (template) having a micropattern is used as an original to form the micropattern on a substrate such as a silicon wafer or glass plate. More specifically, a substrate is coated with a transfer material, and the transfer material is cured while (a pattern of) a mold is pressed against the substrate with the transfer material being sandwiched between them, thereby forming a micropattern. Imprint techniques presently put into practical use are the heat cycle method and photocuring method.

Japanese Patent No. 4185941 has disclosed a technique of manufacturing semiconductor devices by using the imprint technique. In Japanese Patent No. 4185941, a pattern is formed on the entire surface of a wafer by repeating a process of forming the pattern in a partial region of the wafer. An etching process and oxidation process are performed by using the pattern formed by the imprint technique. A semiconductor device having a multilayered structure is manufactured by repeating this processing. Accordingly, the patterns must be overlaid on the same wafer, and this is the same as in the manufacture of semiconductor devices by the photolithography technique.

As an alignment technique to overlay patterns, techniques that adapt the technique for use in the manufacture of semiconductor devices by the photolithography technique are disclosed in Japanese Patent No. 4185941 and U.S. Pat. No. 7,281,921. U.S. Pat. No. 7,281,921 has disclosed a technique of monitoring the position of a mirror attached to a mold from a main body stand.

In this technique disclosed in U.S. Pat. No. 7,281,921, however, the end face of the mold must be processed to have a surface accuracy measurable by a laser interferometer and coated with a reflecting film, or a member having a reflecting surface with a high surface accuracy must be attached to the mold. Also, the reflecting surface must have a high orthogonality to two end faces among three orthogonal surfaces including a pattern surface and the two end faces. If molds are exchanged with this orthogonality being low, the normals to the two end faces cannot be aligned with the optical axis of a laser interferometer even when the rotational angle around an axis parallel to the pattern surface normal direction is adjusted (this adjustment is generally called "θ alignment"). Consequently, the path of a laser beam emitted from one laser interferometer and reflected by the end face of the mold deviates from a regular path. This makes it impossible to detect the position of the end face of the mold. Note that the surface accuracy of the reflecting surface required for a laser interferometer is generally ¼ or less the wavelength of a laser beam. For example, a laser interferometer using an ordinary He—Ne laser requires a flatness of 0.16 μm or less.

It is technically possible to provide a reflecting surface measurable by a laser interferometer on the end face of a mold. However, the number of times of use of a mold is limited because the mold deteriorates whenever a pattern is transferred. Accordingly, providing a reflecting surface measurable by a laser interferometer on the end face of a mold increases the apparatus cost and mold cost (that is, poses a serious problem in view of the cost).

SUMMARY OF THE INVENTION

The present invention provides a technique capable of suppressing the decrease in overlay accuracy caused by the positional shift of a mold without increasing the cost.

According to one aspect of the present invention, there is provided an imprint apparatus which transfers a pattern of a mold onto a resin applied on a substrate, comprising: a structure including a mold chuck which holds the mold; a first measurement unit configured to measure a position of a reference portion of the structure; a second measurement unit configured to measure a position of the mold with respect to the reference portion; and a controller configured to control a relative positional relationship between the mold and the substrate, based on the measurement result obtained by the first measurement unit and the measurement result obtained by the second measurement unit, the second measurement unit including a head formed on the mold chuck, and measuring the position of the mold with respect to the reference portion by reading a scale formed on the mold by the head.

Further aspects of the present invention will become apparent from the following description of exemplary embodiments with reference to the attached drawings.

DESCRIPTION OF THE EMBODIMENTS

Preferred embodiments of the present invention will be described below with reference to the accompanying drawings. Note that the same reference numerals denote the same members throughout the drawings, and a repetitive description thereof will not be given.

An imprint apparatus 100 as an aspect of the present invention will be explained below with reference to FIGS. 1, 2, and 3. The imprint apparatus 100 includes a structure 6 including a mold chuck 2 for holding a mold 1 having a pattern surface P. In the imprint apparatus 100, a substrate 10 is coated with a resin, and the resin is cured while (the pattern surface P of) the mold 1 is pressed against the substrate 10 with the resin being sandwiched between them, thereby forming (imprinting) a pattern on the substrate 10. A three-dimensional structure forming the pattern is formed on the pattern surface P of the mold 1. In this embodiment, a resin that cures when irradiated with light is used as a transfer material.

The mold chuck 2 has a structure that holds the mold 1 and prevents the removal of the mold 1 from the mold chuck 2 by, for example, vacuum suction. In this embodiment, the mold chuck 2 is strongly connected to the structure 6. Accordingly, the structure 6 can be regarded as a part of the mold chuck 2, and can also be regarded as a member connected to the mold chuck 2.

Interferometers 3a and 3b are attached to the mold chuck 2. As a first measurement unit, the imprint apparatus 100 includes a laser interferometer 15a (on the back side of FIG. 1) and laser interferometer 15b (on the front side of FIG. 1) attached to an apparatus reference member 14a, and a laser interferometer 15g attached to an apparatus reference member 14c. The first measurement unit measures the positions of the interferometer mirrors 3a and 3b, that is, the position of the mold chuck 2. The position of the mold chuck 2 as a reference portion in the Y direction is given by the average value of the position of the interferometer mirror 3a measured by the laser interferometer 15a and the position of the interferometer mirror 3a measured by the laser interferometer 15b. The rotation of the mold chuck 2 around the Z-axis is given by the difference between the position of the interferometer mirror 3a measured by the laser interferometer 15a and the position of the interferometer mirror 3a measured by the laser interferometer 15b. The position of the mold chuck 2 in the X direction is given by the position of the interferometer mirror 3b measured by the laser interferometer 15g. The position of the mold chuck 2 in the Y direction is based on the apparatus reference member 14a. Also, the position of the mold chuck 2 in the X direction is based on the apparatus reference member 14c.

Each of the three laser interferometers 15a, 15b, and 15g is designed as, for example, a biaxial measurement type interferometer. In this case, it is possible to detect a distance by the average value of the measurement values of two axes, and detect a tilt by the difference between the measurement values of the two axes. Each of the three laser interferometers 15a, 15b, and 15g can also be designed as a biaxial measurement type interferometer by arranging two uniaxial interferometers. Note that a laser interferometer measures the displacement when a measurement target (interferometer mirror) moves close to or away from a light source that emits a laser beam.

The imprint apparatus 100 also includes an encoder 7 as a second measurement unit for measuring the position of the mold 1 with respect to the mold chuck 2 as a reference portion. The encoder 7 includes a head 7a formed on the mold chuck 2, and a scale 7b formed on the mold 1, and measures the position of the mold 1 with respect to the mold chuck 2 by reading the scale 7b by the head 7a. In other words, the encoder 7 of this embodiment measures the positional shift of the mold 1 based on the mold chuck 2. The encoder 7 (head 7a and scale 7b) is required to measure the positional shift of the mold 1 with at least an nm-order accuracy. The encoder 7 differs from a laser interferometer in that the encoder 7 measures the displacement when the scale 7b (the mold 1 having the scale 7b) as a read target of the head 7a moves in a plane perpendicular to the direction of the gap between the head 7a and scale 7b.

The scale 7b is formed by arranging two or more kinds of scales having different pitches in different layers. The relative positions of the head 7a and scale 7b are uniquely determined by the phase difference between the scales of the individual layers. Accordingly, the encoder 7 can perform absolute measurement (that is, the encoder 7 can measure the absolute position of the mold 1). The relative position of the mold 1 measured by the encoder 7 with respect to the mold chuck 2 as a reference portion includes the offset amount when the mold 1 is set in the mold chuck 2, and a positional shift produced when a force is applied to the mold 1. The offset amount can easily be obtained from the read value of the encoder 7 (head 7a and scale 7b), because the encoder 7 can perform absolute measurement.

In this embodiment as described above, the position of the mold 1 is detected based on the position of the mold chuck 2 as a reference portion of the structure 6 including the mold chuck 2, and the position of the mold 1 with respect to this reference portion. The position of the mold chuck 2 is measured based on the apparatus reference members 14a and 14c. The position of the mold chuck 2 as a reference portion is determined by, for example, adding the difference between the reference position of the mold chuck 2 (the origin of the mold chuck 2) and the positions of the interferometer mirrors 3a and 3b to the position measured by the laser interferometers 15a, 15b, and 15g. The position of the mold 1 with respect to the mold chuck 2 as a reference portion is determined by adding the difference between the position of the encoder 7 and the reference position of the mold chuck 2 to the position measured by the encoder 7.

In the imprint apparatus 100 of this embodiment, the position of the mold 1 with respect to the mold chuck 2 as a reference portion (that is, the positional shift of the mold 1) is measured using not a laser interferometer but the encoder 7. This obviates the need to form any reflecting surface measurable by a laser interferometer on the end face of the mold 1. Consequently, the imprint apparatus 100 can suppress the decrease in overlay accuracy caused by the positional shift of the mold without increasing the cost.

Figure 4:
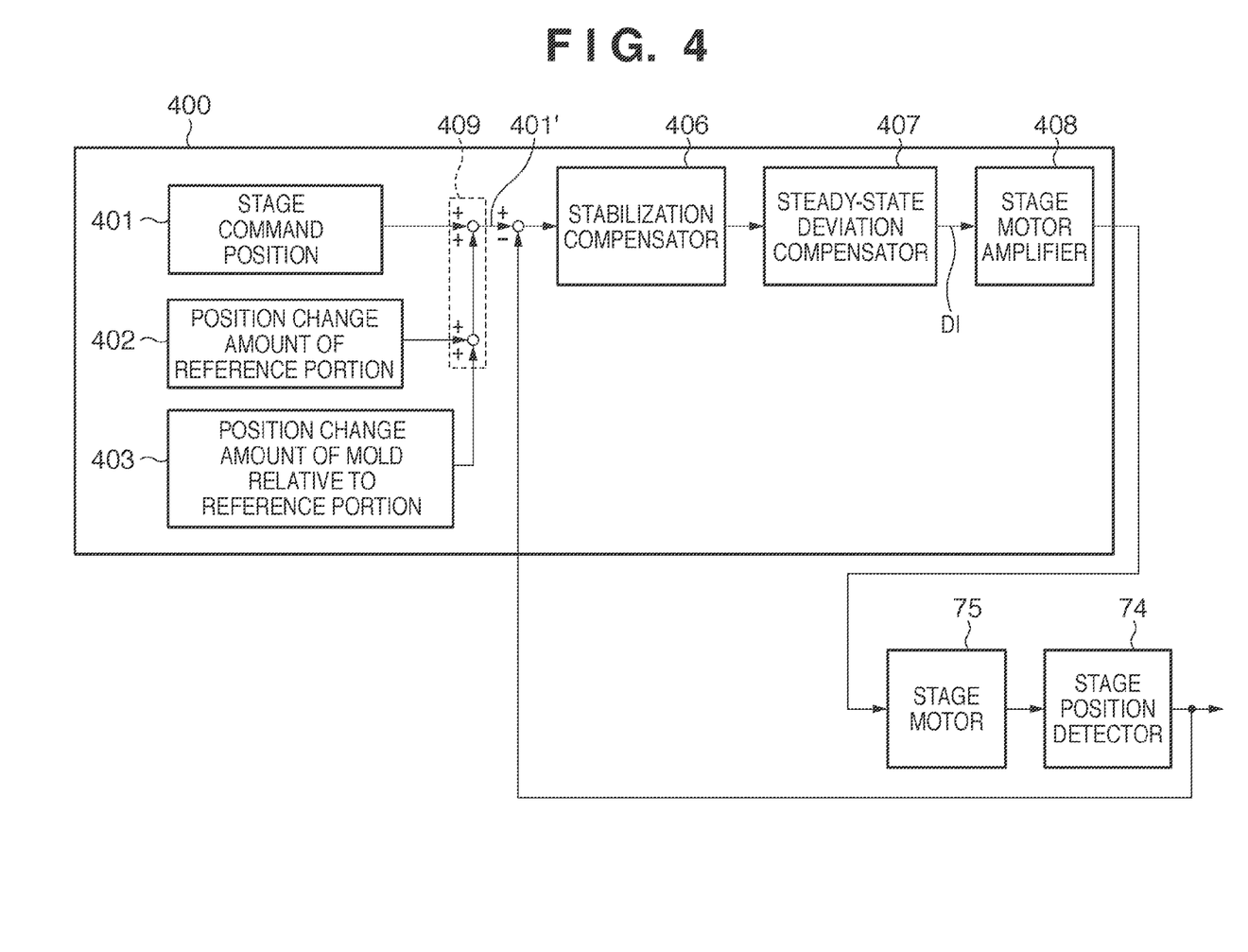
FIG. 4 is a view showing the arrangement of a controller of the imprint apparatus as the aspect of the present invention.

The arrangement of a controller 400 of the imprint apparatus 100 will be explained below with reference to FIG. 4. The controller 400 has a function of controlling the relative positional relationship between the mold 1 and substrate 10. In other words, the controller 400 controls the target position of the substrate 10 so that the mold 1 and substrate 10 have a predetermined positional relationship. More specifically, the controller 400 determines a position (to be referred to as "a stage command position" hereinafter) 401 of a substrate stage 24 for holding the substrate 10, as the target position. Also, the controller 400 detects the position of the mold chuck 2 as a reference portion based on the measurement results obtained by the laser interferometers 15a, 15b, and 15g, and calculates a change amount (to be referred to as "a position change amount of the reference portion" hereinafter) 402 of the detected position. In addition, the controller 400 detects the position of the mold 1 relative to the mold chuck 2 based on the measurement result obtained by the encoder 7, and calculates a change amount (to be referred to as "a relative position change amount of the mold" hereinafter) 403 of the detected relative position.

When the position of the mold 1 has shifted to the + side, for example, the pattern of the mold 1 to be formed on the substrate 10 shifts to the + side if the stage command position 401 is not corrected to the + side. The controller 400 includes a correction unit 409 that corrects the stage command position 401 by adding the position change amount 402 of the reference portion and the relative position change amount 403 of the mold to the stage command position 401, and outputs a corrected stage command position 401'. In other words, the correction unit 409 corrects the stage command position 401 as the target position of the substrate stage 24 (the target position of the substrate 10) based on the measurement results obtained by the laser interferometers (first measurement unit) 15a, 15b, and 15g, and the measurement result obtained by the encoder (second measurement unit) 7. By thus correcting the stage command position 401, it is possible to reduce the positional shift of the pattern to be formed on the substrate 10, which is caused by the positional shift of the mold 1.

The corrected stage command position 401' is compared with the detection result obtained by a stage position detector 74 that includes laser interferometers 15c and 15e and detects the position of the substrate stage 24. The difference signal (deviation signal) is supplied to a compensation unit including a stabilization compensator 406 and steady-state deviation compensator 407. This compensation unit generates a drive instruction DI by performing a compensating operation on the difference signal. The drive instruction DI is supplied to a stage motor amplifier 408. The stage motor amplifier 408 drives a stage motor 75 including linear motors 23a, 23b, and 23c, thereby positioning the substrate stage 24 (substrate 10), and controlling the positional relationship between the mold 1 and substrate 10.

Figure 1:
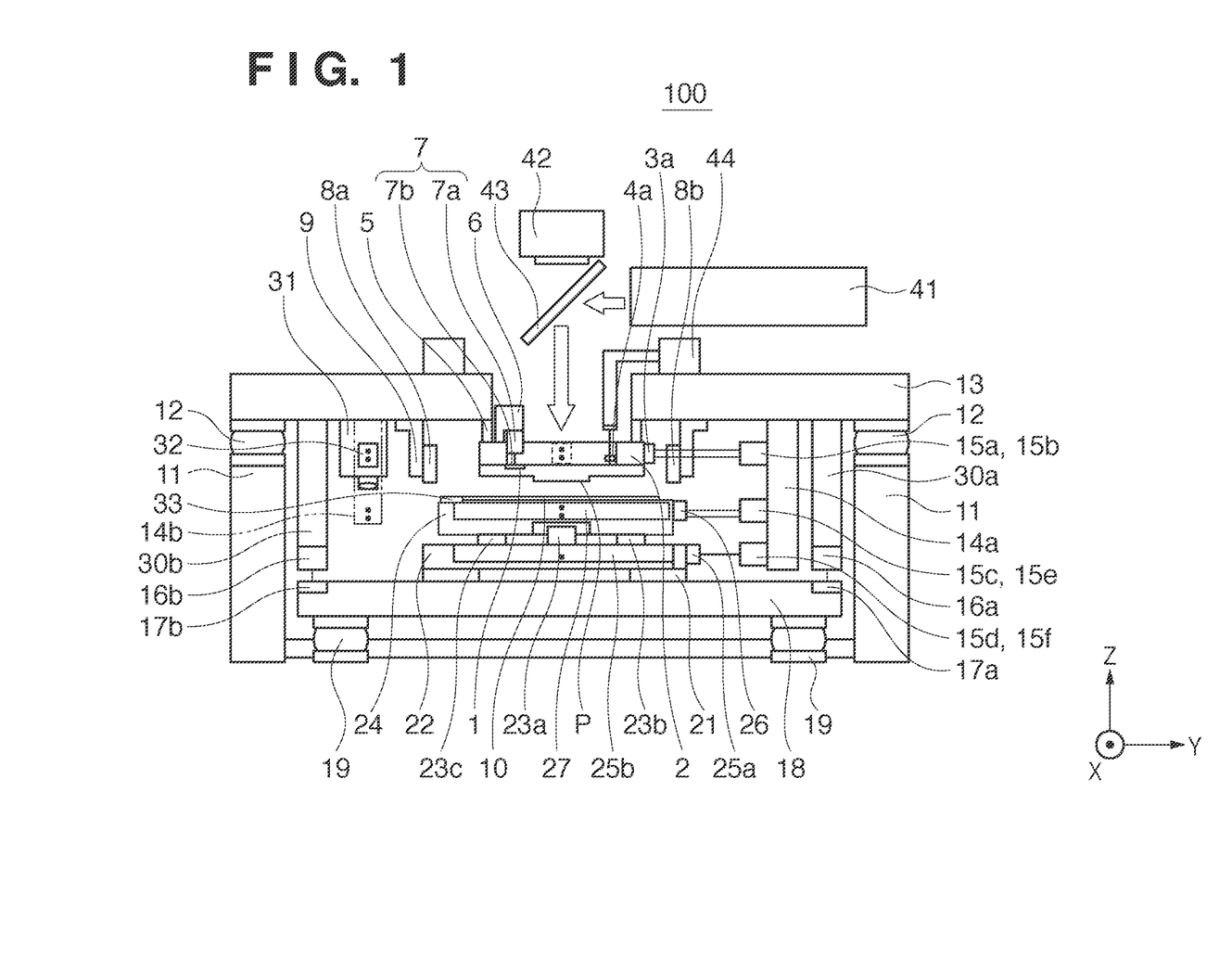
FIG. 1 is a view showing an imprint apparatus as an aspect of the present invention.
Figure 2:
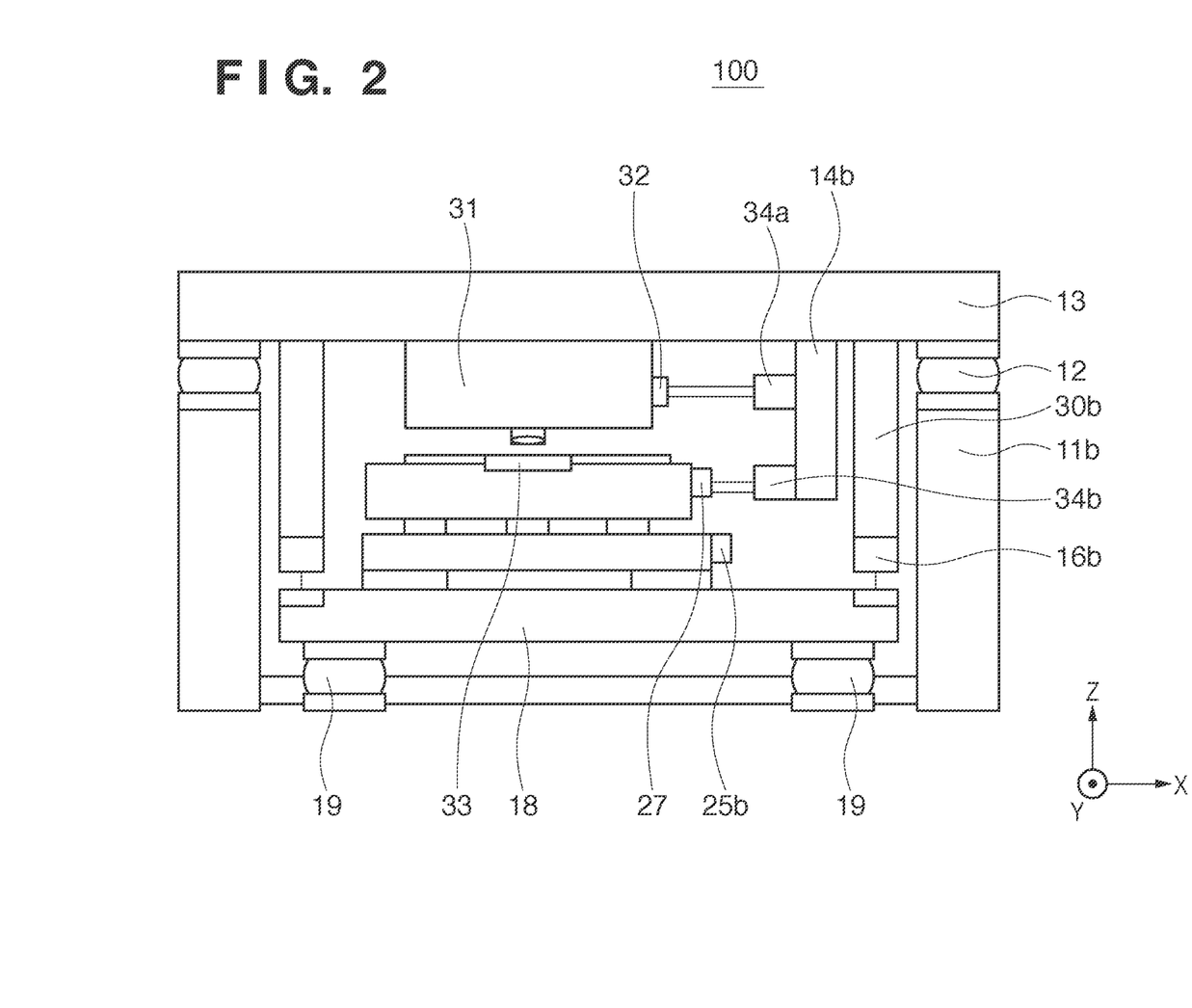
FIG. 2 is a view showing the imprint apparatus as the aspect of the present invention.

As shown in FIG. 1, the mold chuck 2 of this embodiment is supported by a bridge platen 13 via a coupling member 5. However, the mold chuck 2 may directly be fixed to the bridge platen 13. Similar to the mold chuck 2, an aligning microscope 44 is also supported by the bridge platen 13. A half mirror 43 is set above the mold chuck 2. Light from a photocuring light source 41 is reflected by the half mirror 43, and irradiates a resin on the substrate 10 through the mold 1. The resin cures by the irradiation with the light from the photocuring light source 41. A camera 42 is set above the half mirror 43. This makes it possible to check the pressed state of the mold 1 through the half mirror 43.

The bridge platen 13 is supported on columns 11 via air springs 12 for insulating vibrations from the floor. The air springs 12 each have an arrangement generally adopted as an active anti-vibration function in exposure apparatuses. More specifically, the air springs 12 each include XYZ relative position measurement sensors attached to upper and lower members of the air spring, XYZ-direction driving linear motors, and a servo valve for controlling the internal air volume of the air spring.

Dispensers 8a and 8b for coating the substrate 10 with a photocurable resin are attached to the bridge platen 13 by using holders 9. For example, the dispensers 8a and 8b coat the substrate 10 with the resin by using an inkjet head for use in an inkjet printer. Rectangular regions on the substrate 10 can be coated with the resin by scanning the substrate state 24 (that is, the substrate 10) while coating the substrate 10 with the resin by the dispensers 8a and 8b. Note that the region to be coated with the resin need not have a rectangular shape, so a region having any arbitrary shape (for example, a circle) can be coated with the resin. This region to be coated with the resin will be called a shot region hereinafter. When using a dispenser capable of simultaneously coating shot regions on the substrate with the resin, it is unnecessary to scan the substrate while coating it with the resin.

The shape of the wafer as the substrate 10 is generally a circle. When the wafer is filled with rectangular shot regions, therefore, a shot region extends from the wafer in the peripheral region and a rectangular shot region cannot be secured any longer in the peripheral region. A shot region like this is called a chipped shot region. Presently, a plurality of chips can be formed in a 33 mm×26 mm shot region, and a pattern must be formed even in a chipped shot region in order to efficiently form chips on a wafer.

Also, when manufacturing a semiconductor device by using the imprint technique, a film (called "a residual film") remains in recesses of a three-dimensional pattern formed on the substrate 10, and this residual film must be etched away. The thickness of the film remaining in recesses is called an RLT (Residual Layer Thickness). If a film having the RLT is not formed in a chipped shot region, a deep hole is formed in the wafer by etching. To prevent this, it is effective to apply the resin on the peripheral region. In this case, if the resin is applied into a rectangular shape, the resin extends from the wafer. If the wafer is irradiated with light in this state, the resin cures and adheres on a substrate chuck for fixing the wafer. Consequently, the wafer is adhered to the substrate chuck. In addition, a wafer to be processed next is held on the deposit, and the surface accuracy of the wafer surface deteriorates to make it impossible to form a normal pattern. Therefore, the resin is applied on an appropriate region of the wafer by combining the driving operations of the dispensers 8a and 8b and substrate stage 24. In this embodiment, the dispenser 8b applies the resin in the +Y direction side of the substrate 10, and the dispenser 8a applies the resin in the −Y direction side of the substrate 10.

The bridge platen 13 includes an aligning microscope (off-axis scope: OAS) 31 for measuring the position of an alignment mark formed on the substrate 10. As shown in FIG. 2, an interferometer mirror 32 is attached to the side surface of the OAS 31 so as to be able to reflect a laser beam from a laser interferometer 34a. The laser interferometer 34a is installed to be able to measure the distance in the X direction from an apparatus reference member 14b fixed to the bridge platen 13 to the OAS 31.

The substrate stage 24 for holding the substrate 10 and the driving mechanism of the substrate stage 24 will be explained below. In this embodiment, to prevent the transmission of a vibration and deformation due to the driving of the substrate stage 24 to the bridge platen 13, a base 18 for supporting the substrate stage 24 is installed on the floor with air springs (anti-vibration devices) 19 being inserted between them. Sensors (for example, laser interferometric measuring devices or encoders) 16a, 16b, 16c, and 16d fixed to brackets 30 extending downward from the bridge platen 13 measure the distance between the bridge platen 13 and substrate stage 24 in the Z direction. Members 17a, 17b, 17c, and 17d are measurement targets respectively corresponding to the sensors 16a, 16b, 16c, and 16d, and attached to the base 18. The members 17a, 17b, 17c, and 17d are mirrors when the sensors 16a, 16b, 16c, and 16d are laser interferometric measuring devices, and scales when they are encoders.

In this embodiment, the distances between the bridge platen 13 and base 18 are measured at four points. In practice, however, the distance and tilt in the Z direction can be obtained by performing measurements at three points. The position and tilt of the substrate 10 can be corrected (adjusted) by controlling the position and tilt of the substrate stage 24 with respect to the base 18 based on the position and tilt of the base 18 in the Z direction. Note that the adjustment amounts of the substrate stage 24 can be decreased by properly adjusting the heights of the air springs 12 and 19.

A coarse movement stage 22 is placed on the base 18. The coarse movement stage 22 includes a plurality of air pads 21, and floats over the base 18 at a static pressure. If the base 18 tilts or is swung by the driving counterforce when the coarse stage 22 is driven in the X and Y directions, the pattern formation accuracy decreases. Accordingly, the tilt and counterforce of the base 18 are reduced by, for example, driving a dummy load in the opposite direction to the driving direction of the coarse movement stage 22. The coarse movement stage 22 includes mirrors 25a and 25b, and laser interferometers 15d and 15f and the laser interferometer 15g (lower) attached to the apparatus reference members 14a and 14c in the X and Y directions measure the distances from the apparatus reference members 14a and 14c. Similar to the apparatus reference member 14a in the Y direction, three biaxial measurement type interferometers are vertically arranged on the apparatus reference member 14c in the X direction. The laser interferometer 15g (upper) measures the distance to the mold chuck 2 in the X direction. The laser interferometer 15g (middle) measures the distance in the X direction to a mirror 27 attached to the substrate stage 24. The laser interferometer 15g (lower) measures the distance in the X direction to the mirror 25a attached to the coarse movement stage 22.

The substrate stage 24 as a fine movement stage is placed on the coarse movement stage 22. The substrate stage 24 is supported as it is floated without physically contacting the coarse movement stage 22 by the linear motors 23a, 23b, and 23c attached to the coarse movement stage 22 and having a weight canceling function. This makes it possible to separate the substrate stage 24 from vibrations that are not completely attenuated but transmitted from the air springs 19. However, the position of the substrate stage 24 cannot be controlled in this state. Therefore, a mirror 26 and the mirror 27 are attached to the side surfaces of the substrate stage 24, and the position in the X direction, the position in the Y direction, the position in a $\omega Z(\theta)$ direction as a rotational direction around the Z-axis, the position in a $\omega X$ direction as a rotational direction around the X-axis, and the position in a $\omega Y$ direction as a rotational direction around the Y-axis are measured by using the mirrors 26 and 27. The laser interferometers 15c and 15e attached to the apparatus reference member 14a in the Y direction and the laser interferometer 15g (middle) attached to the apparatus reference member 14c in the X direction perform these measurements.

This arrangement guarantees the positional relationship between the mold 1 and substrate 10 during pattern formation (imprinting). The distance (spacing) between the coarse movement stage 22 and substrate stage 24 in the Z direction can be controlled by incorporating encoders or laser interferometric measuring devices into the linear motors 23a, 23b, and 23c, and using the average value of the measurement results obtained by these devices.

Figure 5:
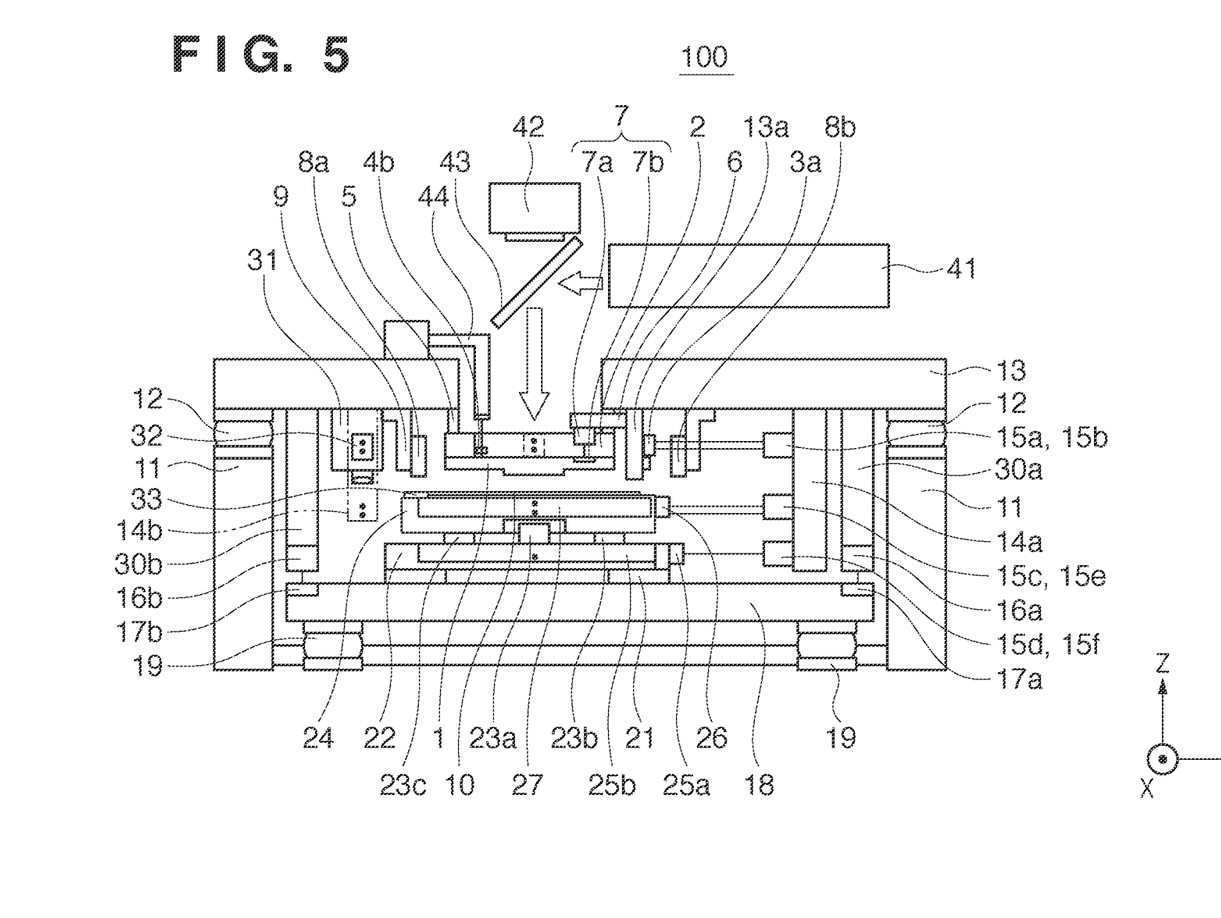
FIG. 5 is a view showing the imprint apparatus as the aspect of the present invention.

Note that as shown in FIG. 5, the reference portion of the structure 6 including the mold chuck 2 can also be a coupling member 13a coupled (fixed) to the bridge platen 13 (or the bridge platen 13 itself), instead of the mold chuck 2. When the coupling member 13a coupled to the bridge platen 13 (or the bridge platen 13 itself) is used as the reference portion, the mirrors 3a and 3b attached to the mold chuck 2 must be attached to the coupling member 13a.

The mold chuck 2 vibrates when releasing the mold 1 from the resin on the substrate 10. When the reference portion is the mold chuck 2 (that is, the measurement target portion of the laser interferometer is the mold chuck 2), the position of the mold chuck 2 can be measured even when the mold chuck 2 is vibrating, but the laser interferometer is required to have a high response speed. On the other hand, when the reference portion is the coupling member 13a (that is, the measurement target portion of the laser interferometer is the coupling member 13a), it is possible to use a laser interferometer having a response speed lower than that when the reference portion is the mold chuck 2.

Figure 6:
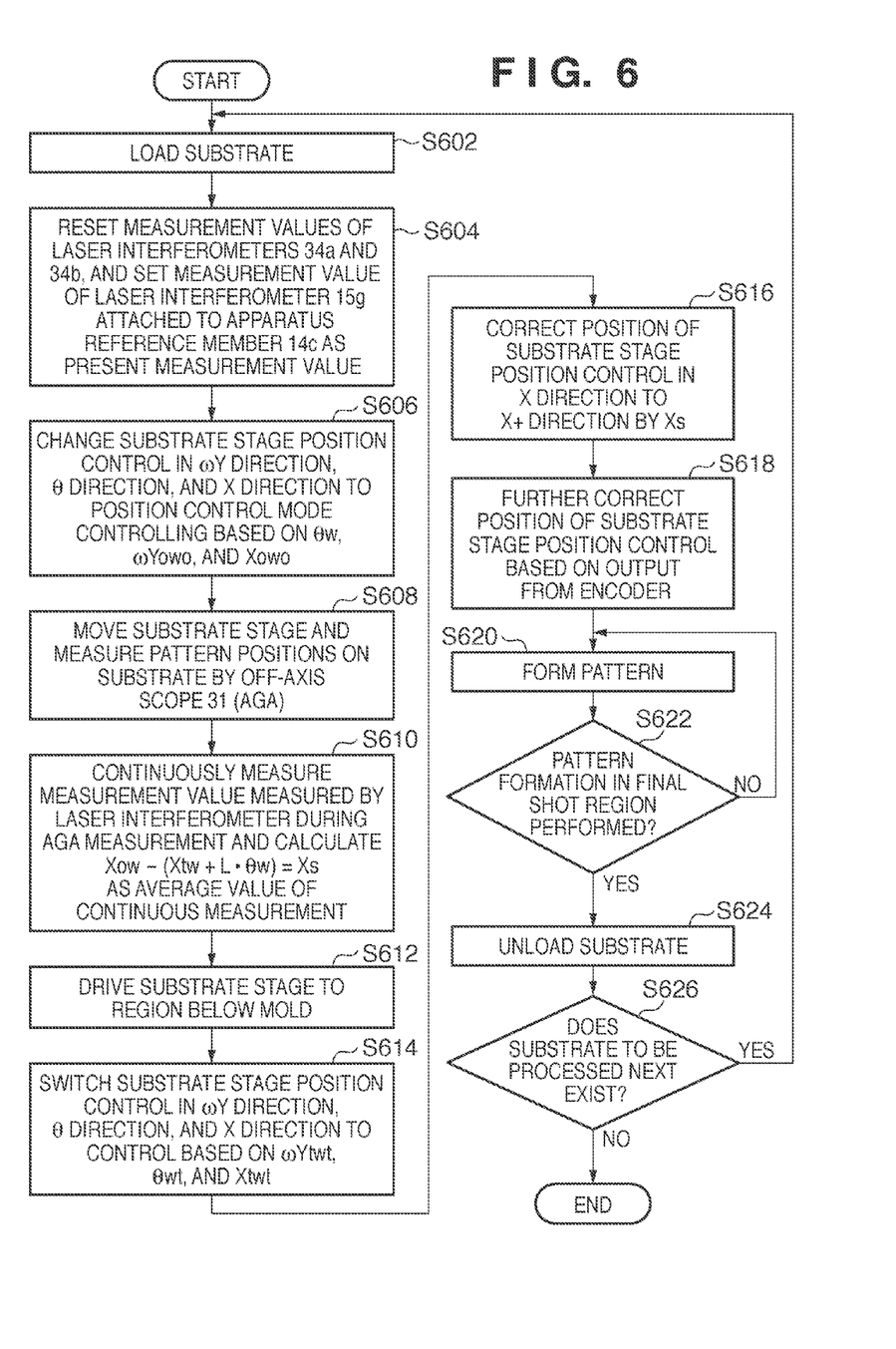
FIG. 6 is a flowchart for explaining the processing of the imprint apparatus as the aspect of the present invention.
Figure 7A:
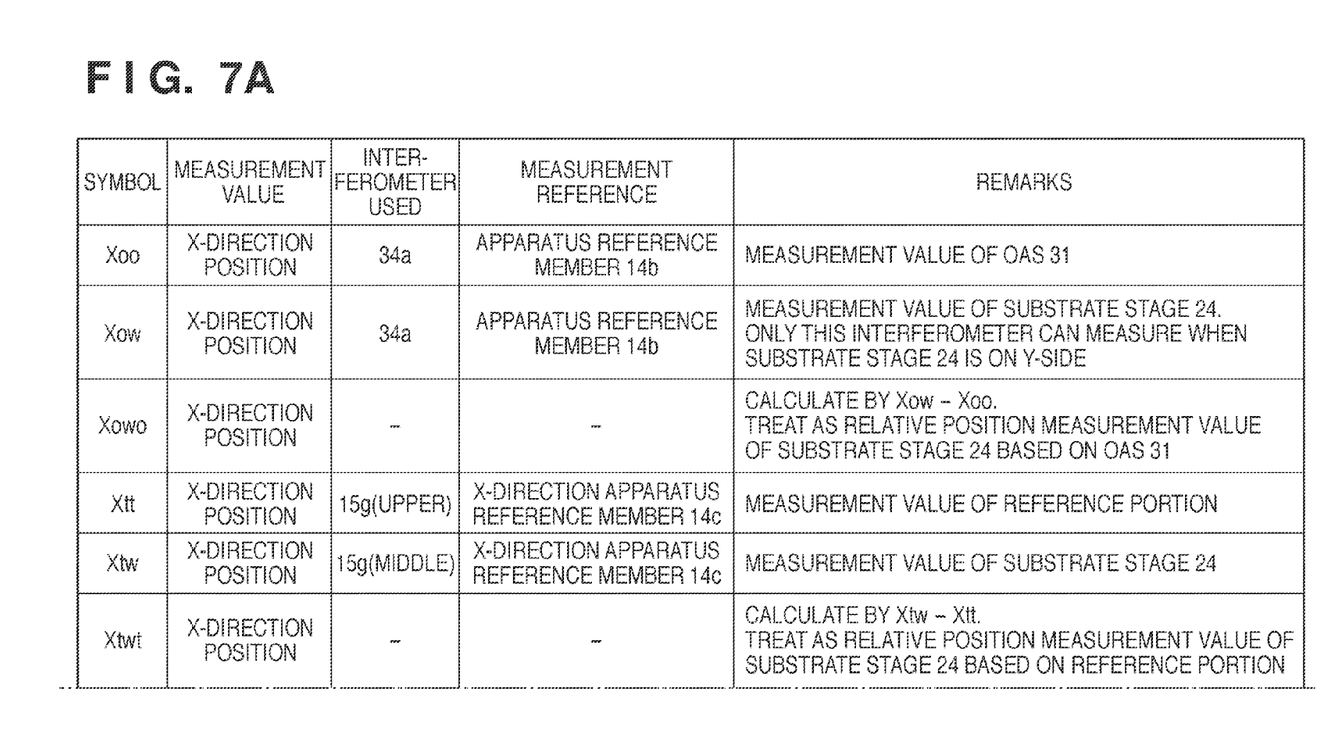
FIGS. 7A and 7B are views for explaining the symbols of measurement values obtained by a laser interferometer of the imprint apparatus as the aspect of the present invention.
Figure 7B:
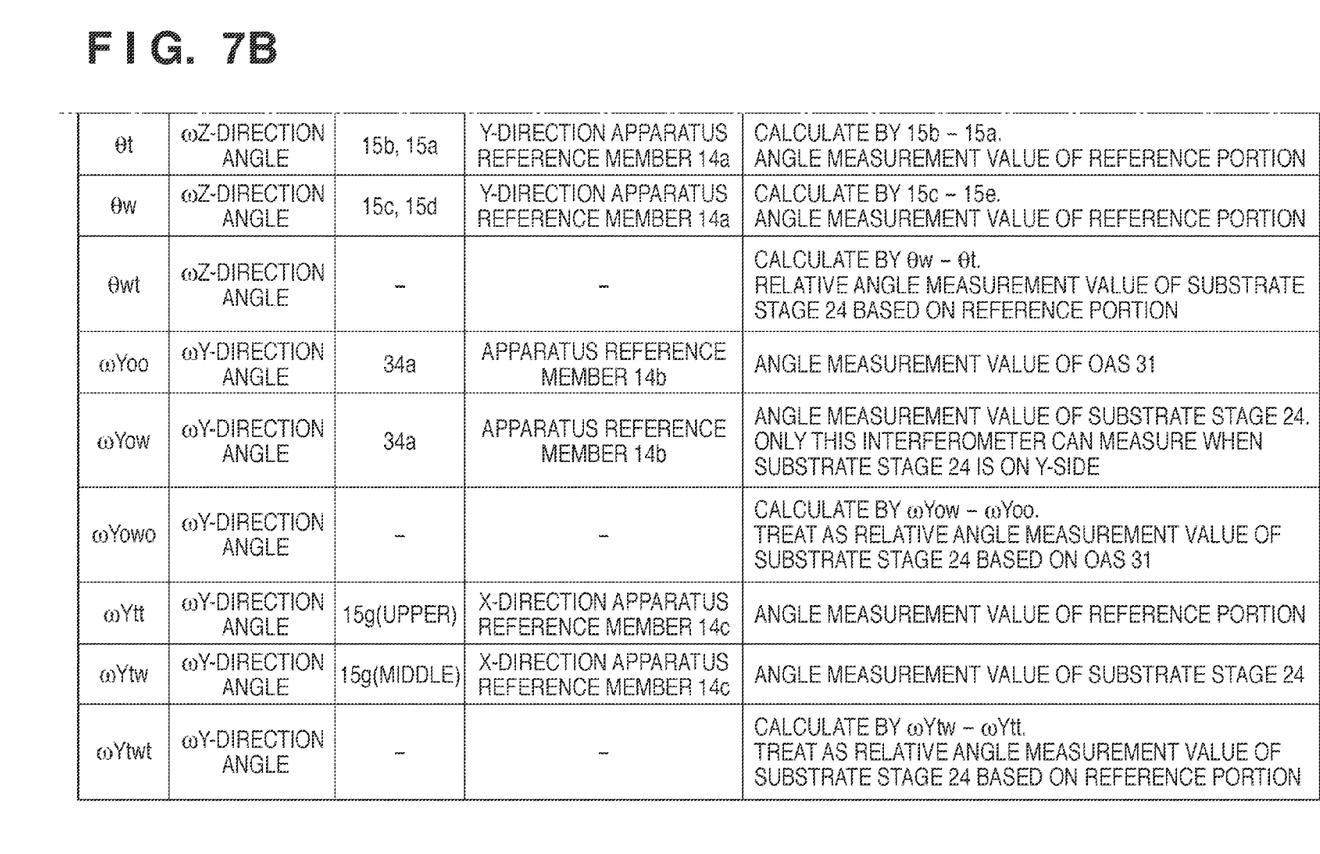

Processing (that is, an imprint method of transferring a pattern of the mold 1 onto the substrate 10) performed by the imprint apparatus 100 will be explained below with reference to FIGS. 6, 7A and 7B. FIGS. 7A and 7B show the explanation of symbols used in a flowchart shown in FIG. 6.

In S602, the substrate (wafer) 10 is loaded into the imprint apparatus 100, and fixed on the substrate chuck of the substrate stage 24. Whenever a predetermined number of substrates 10 are processed, an error of the positional relationship between the reference position of the OAS 31 and the mold 1 is measured using a stage reference mark 33 formed on the substrate stage 24. Note that in this embodiment, a transport unit having a function of loading the substrate 10 into the imprint apparatus 100 and a function of unloading the substrate 10 from the imprint apparatus 100 is installed on the left side of FIG. 1. When loading or unloading the substrate 10 in S602, the substrate stage 24 moves in the −Y direction and is positioned near the transport unit. This can shorten the time required for the transport unit to transport the substrate 10.

In S604, a laser interferometer 34b attached to the apparatus reference member 14b measures the position of the substrate stage 24. Since the mirror 27 attached to the substrate stage 24 has also moved toward the −Y side in S602, the laser interferometer 34b can measure the position of the substrate stage 24. In this embodiment, the laser interferometers 34a and 34b are reset when the substrate stage 24 moves in the −Y direction and becomes measurable by the laser interferometer 34b. A laser interferometer generally uses the relative distance measurement method. When a laser interferometer is reset, therefore, the present distance (position) must be given to the laser interferometer from a controller of the host apparatus. Accordingly, measurement values X and $\omega Y$ of the substrate stage 24 obtained by the laser interferometer 15g (middle) attached to the X-direction apparatus reference member 14c are set as the present measurement values of the laser interferometer 34b.

In S606, the position control modes of the substrate stage 24 in the X direction and $\omega Y$ direction are changed. Until this timing, the positions of the substrate stage 24 in the X and $\omega Y$ directions are controlled by measurement values Xtwt and $\omega Y$twt obtained by the laser interferometer 15g attached to the X-direction apparatus reference member 14c. Xtwt is the relative position measurement value of the substrate stage 24 based on the reference portion calculated by the measurement value (Xtw) of the substrate stage 24 obtained by the laser interferometer 15g (middle), and the measurement value (Xtt) of the reference portion obtained by the laser interferometer 15g (upper). $\omega Y$twt is the relative angle measurement value of the substrate stage 24 based on the reference portion calculated by the angle measurement value ($\omega Y$tw) of the substrate stage 24 obtained by the laser interferometer 15g (middle), and the angle measurement value ($\omega Y$tt) of the reference portion obtained by the laser interferometer 15g (upper).

Until this point, the position of the substrate stage 24 is controlled based on the position relative to the mold chuck 2 (or the coupling member 13a) as a reference portion, in all directions except for the Z direction of the six general degrees of freedom. This control state can be switched (changed) to control based on the measurement results obtained by the OAS 31, for the X direction and $\omega Y$ direction. It is also possible to switch control based on $\theta$wt to control based on $\theta$w, for the $\theta$ direction. $\theta$t is the angle measurement value in the $\omega Z$ direction calculated by the measurement values obtained by the laser interferometers 15a and 15b. $\theta$w is the angle measurement value in the $\omega Z$ direction calculated by the measurement values obtained by the laser interferometers 15c and 15e. $\theta$wt is the relative angle measurement value of the stage based on the reference portion, which is calculated from $\theta$t and $\theta$w.

In S608, the OAS 31 measures the pattern position on the substrate 10 (AGA measurement). If the change in S606 described above is not performed, the AGA measurement value produces an error if the position of the reference portion shifts for some reason during the AGA measurement.

In S610, a switching error of measurement values Xow and Xtw is obtained by an averaging process during the AGA measurement. Xow is the angle measurement value of the substrate stage 24 in the ωY direction measured by the laser interferometer 34b. In S612, the substrate stage 24 is driven to a region below the mold 1. In S614 to S618, the references for controlling the substrate stage 24 are switched. Note that FIG. 6 shows an example in which the stage command position is corrected before imprinting. As has been explained previously with reference to FIG. 4, however, the stage command position can also be corrected in real time based on the positional shift of the mold 1.

Figure 3:
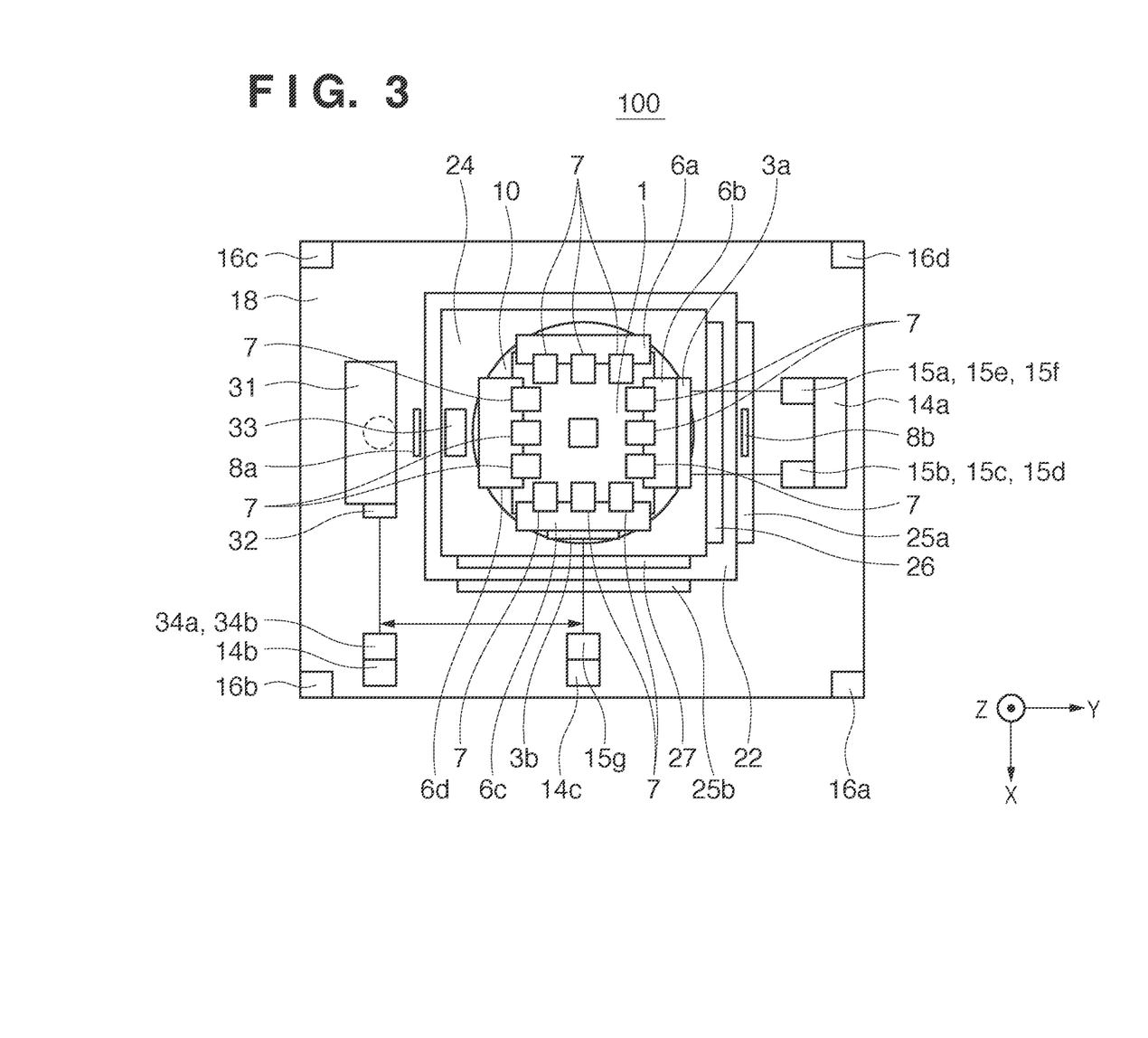
FIG. 3 is a view showing a part of the imprint apparatus as the aspect of the present invention.

In the structure shown in FIG. 3, three encoders 7 are arranged for each of the four sides (that is, along each periphery) of the mold 1 (mold chuck 2). This makes it possible to measure the shape deformation (distortion) of the mold 1, in addition to the positional shift of the mold 1 caused by mold release. Accordingly, the magnification component and deformation component are separated from the measurement results obtained by the total of twelve encoders 7, and the XY shift amount and rotational amount in the center of the mold 1 are separated based on the separated components, thereby correcting the position of the substrate stage 24. Note that the number of encoders 7 is not limited to twelve, and need only be two or more. However, the larger the number of encoders 7, the higher the accuracy of correction value measurement. The shape deformation of the mold 1 can also be canceled by using a mechanism of correcting the shape deformation by adding a force to the mold 1 in accordance with the shape deformation.

In S620, pattern formation is performed on the entire surface of the substrate 10 by imprinting. In S622, whether pattern formation is performed in a final shot region on the substrate 10 by imprinting is determined. If no pattern formation is performed in the final shot region by imprinting, pattern formation is performed in the next shot region in S620. If pattern formation is performed in the final shot region by imprinting, the substrate 10 is unloaded in S624. In S626, whether there is a substrate 10 to be processed next is determined. If there is a substrate 10 to be processed next, the process returns to S602 and continues. On the other hand, if there is no substrate 10 to be processed next, the process is terminated.

As described above, the imprint apparatus 100 can suppress the decrease in overlay accuracy caused by the positional shift of the mold 1 without increasing the cost. Accordingly, the imprint apparatus 100 can economically provide high-quality articles with a high throughput.

A method of manufacturing devices (for example, a semiconductor integrated circuit device and liquid crystal display device) as articles includes a step of transferring (forming) a pattern onto a substrate (for example, a wafer, glass plate, or film-like substrate) by using the imprint apparatus 100. This manufacturing method further includes a step of etching the substrate onto which the pattern has been transferred. Note that when manufacturing another article such as a pattern dot medium (recording medium) or optical device, this manufacturing method includes another processing step of processing the substrate onto which the pattern has been transferred, instead of the etching step.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2009-279814 filed on Dec. 9, 2009, which is hereby incorporated by reference herein in its entirety.

What is claimed is:

1. An imprint apparatus that forms a pattern of a mold onto a resin applied on a substrate, the imprint apparatus comprising:
   a mold holder that holds the mold;
   a substrate holder that holds the substrate;
   a first measurement unit configured to measure a position of the mold holder;
   a second measurement unit, including a detecting head, which is provided on the mold holder, that reads a scale provided on the mold, configured to measure a position of the mold with respect to the mold holder based on the scale reading result obtained by the detecting head;
   a third measurement unit configured to measure a position of the substrate holder; and
   a controller configured to:
   calculate the position of the mold based on the measured position of the mold holder obtained by the first measurement unit and the measured position of the mold obtained by the second measurement unit;
   calculate the position of the substrate based on the measured position obtained by the third measurement unit; and
   control a relative position between the mold and the substrate based on the calculated position of the mold and the calculated position of the substrate.

2. The apparatus according to claim 1, wherein the controller corrects a target position of the substrate based on the measured position of the mold holder obtained by the first measurement unit, the measured position of the mold obtained by the second measurement unit, and the measured position of the substrate obtained by the third measurement unit, and positions the substrate in accordance with the corrected target position, to control the relative position between the mold and the substrate.

3. The apparatus according to claim 1, wherein the second measurement unit includes at least two detecting heads arranged along a periphery of the mold holder.

4. A manufacturing method of articles comprising:
   a step of using an imprint apparatus that forms a pattern of a mold onto a resin applied on a substrate; and
   a step of processing the substrate with the pattern,
   wherein the imprint apparatus includes:
   a mold holder that holds the mold;
   a substrate holder that holds the substrate;
   a first measurement unit configured to measure a position of the mold holder;
   a second measurement unit, including a detecting head, which is provided on the mold holder, that reads a scale provided on the mold, configured to measure a position of the mold with respect to the mold holder based on the scale reading result obtained by the detecting head;
   a third measurement unit configured to measure a position of the substrate holder; and
   a controller configured to:
   calculate the position of the mold based on the measured position of the mold holder obtained by the first measurement unit and the measured position of the mold obtained by the second measurement unit;
   calculate the position of the substrate based on the measured position obtained by the third measurement unit; and
   control a relative position between the mold and the substrate based on the calculated position of the mold and the calculated position of the substrate.

5. The apparatus according to claim 3, wherein the second measurement unit measures a magnification component of the mold based on the scale read by the at least two detecting heads, respectively.

6. The apparatus according to claim 3, wherein the second measurement unit measures a rotational component of the mold based on the scale read by the at least two detecting heads, respectively.

7. The apparatus according to claim 1, wherein:
the detecting head is arranged so that the scale is readable, and
the scale is formed on an outside of a region in which the pattern of the mold is formed.

* * * * *